United States Patent [19]

Hoffman et al.

[11] Patent Number: 4,845,366

[45] Date of Patent: Jul. 4, 1989

[54] SEMICONDUCTOR DOPANT VAPORIZER

[75] Inventors: Gregory C. Hoffman, San Marcos; Mark A. Logan; Justice N. Carman, both of Carlsbad, all of Calif.

[73] Assignee: Air Products and Chemicals, Inc., Allentown, Pa.

[21] Appl. No.: 138,924

[22] Filed: Oct. 23, 1987

[51] Int. Cl.$^4$ .............................................. H01J 27/00
[52] U.S. Cl. .................................................... 250/425
[58] Field of Search .......................... 250/423 R, 425; 313/359.1

[56] References Cited

U.S. PATENT DOCUMENTS

| 2,824,967 | 2/1958 | Kamen | 250/425 |
| 3,888,107 | 6/1975 | Langer et al. | 250/425 |

Primary Examiner—Bruce C. Anderson
Attorney, Agent, or Firm—James C. Simmons; William F. Marsh

[57] ABSTRACT

The present invention involves apparatus and methods for introducing ion source material into an ion implant system for use in connection with Freeman type sources. A vaporizer unit which is removable from the system is prepared for insertion into the ion implant equipment outside the system. It is cleaned, a new vial of ion source material is introduced and it may be preheated to degas it or to prepare it for use in the system. The vaporizer unit which is currently in use is removed, to be cleaned and recharged, and the previously prepared vaporizer unit is inserted, sealed in place and the vacuum established. The ion implant system is, then, ready to resume operation with minimal down time. The vaporizer unit comprises a vaporizer block of high heat conductive material such as copper which includes three cavities or wells. One cavity contains a heater, one a gas flow path for heating and/or cooling, and one contains a sealed vial of semiconductor dopant. Wells for temperature sensors are also provided, as are means for breaking or puncturing the vial once the ion implant system is ready for operation. The evaporator block is mounted, when in use, in the vacuum chamber of the ion implant device, and is connected through gas-tight seals with a face plate which forms a seal closing the vacuum chamber and supporting the vaporizer block. An external operator is provided for transmitting movement into the system for breaking the vial at the desired time.

1 Claim, 2 Drawing Sheets

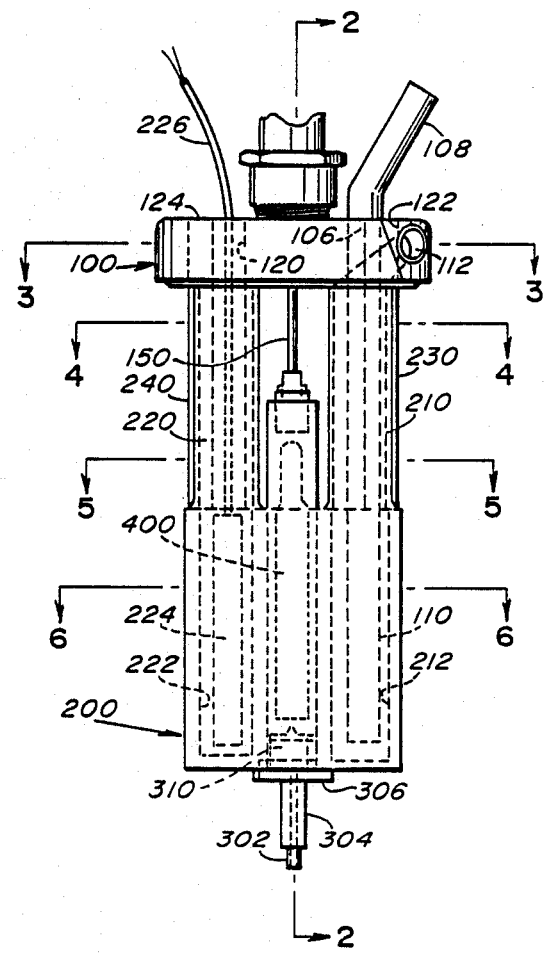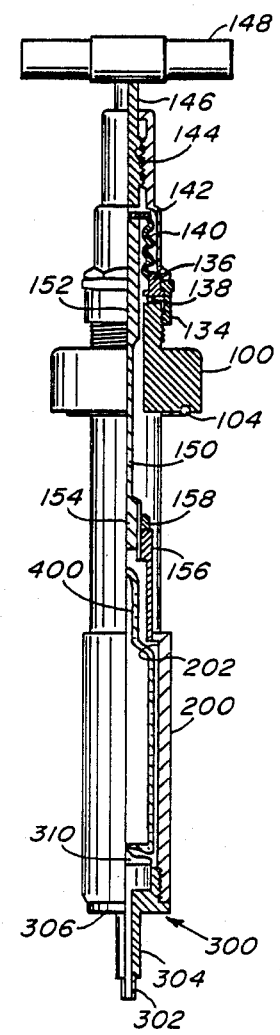
FIG. 1
FIG. 2

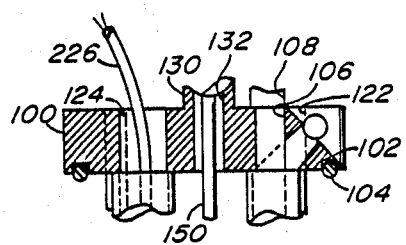
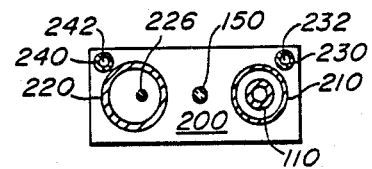
FIG. 3                    FIG. 4
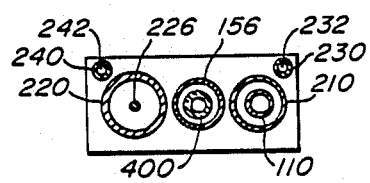
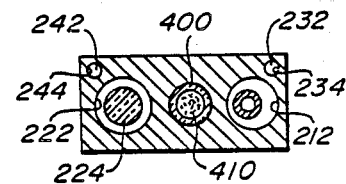
FIG. 5                    FIG. 6
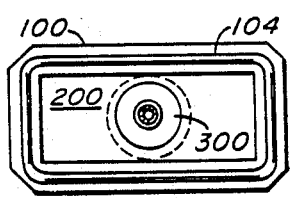
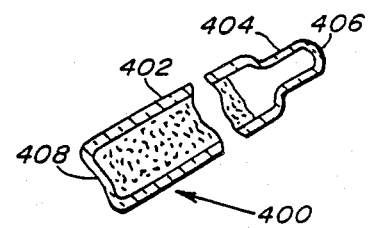
FIG. 7                    FIG. 8
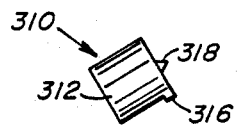
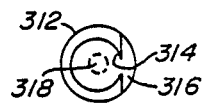
FIG. 9                    FIG. 10

SEMICONDUCTOR DOPANT VAPORIZER

FIELD OF THE INVENTION

This invention relates to semiconductor manufacture and, more specifically, to ion implant methods and apparatus used in the manufacture of semiconductors. The invention has, however, more general application in any ion implant process.

BACKGROUND OF THE INVENTION

Ion implantation is a commonly used process in the manufacture of semiconductors and also in other technologies. For example, surface hardening of tools may be accomplished using ion implant techniques. The principle interest and application of this invention, though not the exclusive ones, are in the manufacture of semiconductors.

Ion implantation equipment is described in many texts and in the literature generally, see, for example, U.S. Pat. Nos. 2,750,541, 2,787,564, and 2,842,466, as well as ENCYCLOPEDIA OF SEMICONDUCTOR TECHNOLOGY, John Wiley & Sons (1984), pp. 397 et seq., Kirk Othmer ENCYCLOPEDIA OF CHEMICAL TECHNOLOGY, article on "Ion Implantation", John Wiley & Sons, and the treatise ION IMPLANTATION, J. K. Hirvonen, ed., Academic Press (1980). Descriptions of such apparatus and uses therefor are found in many other patents, see, for example, U.S. Pat. Nos. 3,457,632, 3,445,926, 3,434,894 and 3,390,019.

Ion implantation technology involves the ionization of an atom of the material to be implanted, accelerating the ion toward the target, a chip or slice of silicon in the present instance, which is to become a semiconductor device or which is a semiconductor device the properties of which are to be modified. The ion beam is focussed to impact a desired area or pattern on the target. The entire operation is carried out in a high vacuum and requires ultra-high purity ion source reagents.

Ion implant equipment is very expensive and is economically used only when operated during a relatively high production rate and with minimum down time. Down time results each time a new ion source must be loaded because of the necessity to restore the vacuum in the system and produce a controlled beam of ions. Thus, it is of the greatest importance that the introduction of a new ion source material be accomplished quickly with minimum interruption of production.

Extremely dangerous reagents such as arsine and phosphine, and other very toxic and sometimes explosive reagents, have been used as ion source materials. These materials are suitable for use in a technical sense but present serious safety risks and the need for extreme safety precautions.

Solid ion source materials, such as various salts of phosphorus, arsenic, boron, etc., are greatly preferred for safety reasons, but solid semiconductor dopants have presented serious technical and operating problems and are not entirely satisfactory. Extended down time problems, poor product quality, etc. have resulted from the difficulty of introducing such source materials into the ion implant equipment.

The present invention offers a simplified method of handling ion source materials and for introducing the same into ion implant equipment which is safe and which minimizes down time and loss of production.

SUMMARY OF THE INVENTION

The present invention involves apparatus and methods for introducing ion source material into an ion implant system for use, in the exemplary embodiment, in connection with the well-known Freeman source or Freeman plasma chamber as it is sometimes described.

A vaporizer unit which is removable from the system is prepared for insertion into the ion implant equipment outside the system. It is cleaned, a new vial of ion source material is introduced and it may be pre-heated to degas it or to prepare it for use in the system. The vaporizer unit which is currently in use is removed, to be cleaned and recharged, and the previously prepared vaporizer unit is inserted, sealed in place and the vacuum established. The ion implant system is, then, ready to resume operation with minimal down time.

The vaporizer unit comprises a vaporizer block of high heat conductive material such as copper which includes three cavities or wells. One cavity contains a heater, one a gas flow path for heating and/or cooling, and one contains a sealed vial of semiconductor dopant. Wells for temperature sensors are also provided, as are means for breaking or puncturing the vial once the ion implant system is ready for operation. The evaporator block is mounted, when in use, in the vacuum chamber of the ion implant device, and is connected through gas-tight seals with a face plate which forms a seal closing the vacuum chamber and supporting the vaporizer block. An external operator is provided for transmitting movement into the system for breaking the vial at the desired time.

In a more specific and exemplary sense, the invention may be described as an evaporator adapted to contain a sealed container of ion source material for an ion implant system which comprises a vacuum chamber, the evaporator, when in use, comprising vaporizer means having means therein for containing a sealed container of ion source material. The invention also includes sealing and supporting means for supporting the vaporizer means in the vacuum chamber of an ion implant system and for sealing said chamber to permit a vacumm to be established therein and means associated with the vaporizer means for rupturing the sealed container of ion source material upon application from force thereto. Actuator means disposed separately from the vaporizer means and outside the vacuum chamber of the ion implant system coupled through means forming a gas tight seal for transmitting force from the actuator means to the rupturing means are also provided. Temperature control means in thermal communication with the vaporizer and means for carrying energy to the temperature control are provided. These are, of course, merely exemplary of the means for performing these various functions all without introducing gas to the vacuum chamber of the ion implant system.

The vaporizer means preferably comprises a thermally conductive block of copper or other thermally conductive material having formed therein a well which comprises the means for containing the sealed container of ion source material and also having formed therein a well for containing the temperature control means.

The thermally conductive block preferably has formed therein at least one well for receiving a temperature sensor, and a fluid well for receiving a stream of temperature control fluid, and fluid flow conduit means for introducing fluid into the fluid well from outside the vacuum chamber of the ion implant system and for carrying fluid from the fluid well outside said vacuum chamber without introducing fluid into said vacuum chamber are provided in the exemplary embodiment.

The rupturing means associated with the vaporizer means comprises, in a preferred form, means forming a projection which is constructed, configured, disposed and adapted to engage the sealed container of ion source material at one point and means such as the end of the thrust rod and associated structure which are adapted to engage the sealed container at another point for forcing the sealed container against the projection. The means for transmitting force from the actuator means comprises, in the exemplary embodiment, a flexible gas tight seal, means for applying force to the side of the flexible gas tight seal outside the vacuum chamber and means for transmitting movement of the flexible gas tight seal to the means adapted to engage the sealed container at another point for thereby applying force to the sealed container.

BRIEF DESCRIPTION OF THE DRAWINGS

FIG. 1 is a front elevational view of the evaporator of this invention, the upper portion being only partially shown.

FIG. 2 is a side elevational view of the evaporator of this invention, the right hand portion of the drawing depicting a cross-section of the evaporator taken in the center thereof along lines 2—2 as shown in FIG. 1.

FIG. 3 is a cross-section of the face plate of the evaporator, which forms the upper portion thereof as shown in FIG. 1, taken substantially along lines 3—3 in the center as shown in FIG. 1.

FIG. 4 is a lateral cross-section of the evaporator of this invention take substantially along lines 4—4 as shown in FIG. 1.

FIG. 5 is a lateral cross-section of the evaporator of this invention take substantially along lines 5—5 as shown in FIG. 1.

FIG. 6 is a lateral cross-section of the evaporator of this invention take substantially along lines 6—6 as shown in FIG. 1.

FIG. 7 is a bottom end view of the evaporator of this invention.

FIG. 8 is a side cross-sectional view of a source vial and source used in connection with this invention.

FIG. 9 is a side view of the thrust cup of the evaporator of this invention which functions to rupture the lower, thinned portion of the source vial.

FIG. 10 is a bottom view of the thrust cup shown in FIG. 9.

DESCRIPTION OF THE PREFERRED EMBODIMENT

In the following description, as in the brief description of the drawings, the precise configurations, and shapes are exemplary of the invention, but certainly are not limiting of the scope of the invention. Particular relationships, shapes, dimensions, configurations, etc. may be varied within the scope of the invention without departing from the purpose, function and scope thereof.

Referring first to FIG. 1, and to the major assembly features of the invention, the evaporator of this invention may be described for conveniences as comprising a face plate 100, an evaporator block 200 which is connected to the face plate 100 by four tubes, a gas tube 210, a heater tube 220 and two thermocouple or thermistor tubes 230 and 240. An injection nozzle assembly 300 is adapted for use, in the example given, with the well-known and conventional Freeman source or plasma generator.

Each of the major assemblies and the components thereof will be described in detail, as to the exemplary embodiment shown in the drawings, but a brief description of the overall function of the invention and the major assemblies thereof as they relate to one another is now given by way of introduction.

The face plate is secured in the ion implantation equipment, and "O" ring forming a seal therewith, such that all but the face plate ad the tubes, wires and handles extending from it are in the vacuum system of the implanation equipment. Ion implantation equipment is described in many texts and in the literature generally, see, for example, ENCYCLOPEDIA OF SEMICONDUCTOR TECHNOLOGY, John Wiley & Sons (1984), pp. 397 et seq., Kirk Othmer ENCYCLOPEDIA OF CHEMICAL TECHNOLOGY, article on "Ion Implantation", John Wiley & Sons, and the treatise ION IMPLANTATION, J. K. Hirvonen, ed., Academic Press (1980). Descriptions of such apparatus and uses therefor are found in many other patents, some of which are listed hereinbefore.

The evaporator of this invention is connected to a gas source, which provides a source of temperature controlled or flow rate controlled gas which flows into the evaporator, to a source of electricity for providing electric heat, and to temperature controllers. The ion souce material is contained in a closed quartz vial which is in the evaporator. The temperature of the evaporator block 200 is adjusted as necessary to provide the desired rate of evaporation of the source material, the ion implant system is evacuated to the desired vacuum level, and the source vial is forced against the thrust cup which breaks the bottom of the vial permitting evaporation of the source from the evaporator through the injector nozzle into the Freeman, or other, type of ion plasma generator. The evaporator block temperature can be adjusted by heating or cooling and maintained at the desired temperature, either a constant or varying temperature, during operation. Indeed, the evaporator block can be pre-heated to the desired temperature thus even further reducing the down-time of the ion bombardment equipment between runs.

Temperature is sensed by thermocouples or thermistors, or any temperature sensing junction or device, which extend through the face plate 100, the two thermistor tubes 230 and 240 and into aligned wells in the evaporator block 200, which is made of a high thermal conductivity material such as copper. Temperature is controlled by a heater in a heater well in the evaporator block 200, the electric energy to which is supplied by conductors extending through the face plate and the heater tube 220 which is aligned with the heater well. Gas which may be used to heat or cool the evaporator block is provided by a conduit extending through the face plate 100 and the gas tube 220 and into a gas well in the evaporator block. Gas, or other fluid, may be caused to flow at any controlled rate or temperature to modify or maintain the temperature of the evaporator block. The ion source, sealed in a quartz (or other inert) vial is in a source well in the evaporator block. The vial is sealed until the vacuum, temperature and all other conditions for proper operation of the ion bombardment apparatus are attained, at which time the vial is broken or ruptured, allowing virtually instantaneous start-up of ion bombardment operation.

With this overall structure and function in mind, reference is made to FIG. 3 which is a cross-sectional view of the face plate taken substantially in the center of the face plate, the view taken parallel to the plane shown in FIG. 1.

The face plate is a block of stainless steel or other suitable material having the passages, grooves, etc. formed therein, or a composite of structures to form a suitable face plate structure. On the bottom, as viewed in FIGS. 1 and 3, of the face plate, a generally rectangular "O" ring groove 102 having rounded corners is formed for receiving an "O" ring 104.

A passageway 106 communicates at the upper end with a gas inlet conduit 108 and at the lower end with an internal gas conduit 110 which extends through the gas tube 210 and introduces gas near the bottom of the gas well in the evaporator block. Another passageway 112 communicates with the gas tube 210 and externally of the face plate 100, forming an exit for the gas entering through conduit 108. Additional means, not part of this invention, may be provided to collect the fluid exiting through passage 112.

Another passageway 120 extends through the face plate in communication with the heater tube 220.

In addition, two passages. 122 and 124, shown in dashed lines only in FIG. 3 (see FIG. 4) communicate with the thermistor tubes 230 and 240.

Generally centered on the outer surface of the face plate, the top as shown in the figures, is an externally threaded extension 130. Passage 132 is formed through the extension 130 and the face plate 100.

The structure and operation of the external actuator for the vial rupture means is described with reference principally to FIG. 2. A retainer cap 134 is engaged by the threads on extension 130 and retains a sealing ring 136 and "O" ring 138 in gas-tight seal to the top of extension 130. The sealing ring 136 supports and is secured to a bellows 140 which comprises generally annular accordion bellows sides and a rigid or semi-rigid top. The bellows 140 completes a total vacuum seal and gas barrier over the passage 132. The bellows is typically of a resilient metal, though resilience is not required in this structure. The "O" ring may be a polymer such as polytetrafluoroethylene or a member of the fluorocarbon polymer family, or of a soft metal such as copper or silver, or of any other material which will form a gas-tight seal. A cap 142 is connected by threads at the bottom to the ring 136 and has a threaded passageway 144 in the top through which a threaded shaft 146, connected to handle 148, extends.

As the handle 148 is turned, the shaft 142 rotates and is moved, by the thread engagement with cap 142, downwardly as shown in the figures, forcing the top of the bellows downwardly. Resting in the bellows is the upper end 152 of a thrust rod 150 the bottom end 154 of which transfers motion to the vial rupture mechanism to be described. The thrust rod is, of course, in the vacuum when this invention is mounted in the ion implantation device and in use.

The rupture mechanism in the vacuum, in use, and associated with the vaporizer block 200 is described with continuing reference primarily to FIG. 2 and secondarily to FIGS. 1, 5, 6, 8, 9 and 10.

The distal end (the lower end, as shown in the figures) of the thrust rod 154 is secured, by threads or otherwise, to an receptacle cap 156, a lock nut 158 being provided in the exemplary embodiment to fix the securement therebetween. The distal end of the receptacle cap 156 is slidably received in vaporizer well 202 formed substantially in the center of the vaporizer block 200. The bottom or distal end of the vaporizer well is closed, except for a vapor passageway, by the injection nozzle assembly 300 which, in turn, comprises a nozzle 302 mounted in the tip of conduit 304 which extends from cap 306, the latter being threadably received in the threaded opening 204 of the vaporizer well 202. A thrust cup 310, best shown in FIGS. 9 and 10, rests on the cap 306 in the vaporizer well 202. The thrust cup 310 comprises a generally cylindrical structure with one sidewall cutaway, an plate closing one end and a point protruding from the plate. The sidewall 312 is a right cylinder with a portion 314 removed, the upper or proximal end being closed by a plate or disk-like end 316 from which the breaker point 318 protrudes upwardly into the vaporizer well 202.

The evaporator of this invention is used in connection with an ion source containing vial, one exemplary form of which is shown in FIG. 8 and enumerated as vial 400. Other shapes and configurations of vials may be used, the vial 400 being an efficient example of the types and shapes of vials which may be used. The vial 400 is formed of quartz, or other material which is inert to the source material and which will not off-gas in vaccum at the operating temperatures encountered in ion implantation devices. The vial 400 is formed of generally cylindrical walls 402 and may include a smaller cylindrical wall portion 404 fused closed after filling by a closure 406. The bottom or distal end of the vial is, preferably, a thin end closure 408 which is more easily breakable or rupturable than the remainder of the vial. The vial, in use, contains a source material 410. Source materials of the type which may be used are described in the literature and may include, for example, solid salts of boron, phosphorus, arsenic, etc. Lithium and sodium tetrafluoroborates, for example, may be used. The composition of the source material is not, however, critical to or a part of this invention, as the invention is capable of general usage with any suitable vaporizable source material.

The heater tube 220 is secured in gas tight relationship and in aligned communication with the heater well 222 of the evaporator block 200. Heat is provided to the evaporator by a heater shown generally at 224, which derives electric energy from an electrical cable 226 which extends through the heater tube 220 and out the top of the face plate 100. The heater is, in the exemplary embodiment, a ceramic body wound with resistance wire, such as nichrome; however, any kind of heater, even a circulating fluid heater, may be used.

The bottom or distal end of the gas tube 210 is connected, in gas-tight relationship, in communication with the gas well 212. The gas inlet conduit 110 extends nearly to the bottom or distal end of the gas well 212. As gas flows into the gas well, it flows upwardly through the well and the gas tube 210 and exits through port 112.

The temperature of the evaporator block is sensed at two points by thermistors, thermocouples or other temperature sensing devices, the leads to which are shown at 232 extending through temperature sensor tube 230 and 242 extending through temperature sensor tube 240 and into wells 234 and 244, respectively, in the sensor block 200, the tubes being in gas tight relationship with the sensor block.

Thus, in terms of apparatus the invention may be described as an evaporator adapted to contain a sealed container of ion source material 400 for an ion implant system which comprises a vacuum chamber, the evaporator, when in use, comprising vaporizer means, the vaporizer block 200 and associates structures, having means therein for containing a sealed container of ion source material, the well 202 being exemplary. The invention also includes sealing and supporting means such as the face plate and associated structures for supporting the vaporizer means in the vacuum chamber of an ion implant system and for sealing said chamber to permit a vacuum to be established therein and means associated with the vaporizer means for rupturing the sealed container of ion source material upon application from force thereto. The rupturing means includes, exemplary, the thrust cup, thrust rod, and associated structures. Actuator means disposed separately from the vaporizer means and outside the vacuum chamber of the ion implant system coupled through means forming a gas tight seal for transmitting force from the actuator means to the rupturing means, exemplary of which is the bellows assembly and related structures, are also provided. Temperature control means in thermal communication with the vaporizer, such as, for example, the heater 224, and means such as the electric cable 226 for carrying energy to the temperature control are also provided. These are, of course, merely exemplary of the means for performing these various functions all without introducing gas to the vacuum chamber of the ion implant system.

The vaporizer means preferably comprises a thermally conductive block 200 of copper or other thermally conductive material having formed therein a well which comprises the means for containing the sealed container of ion source material and also having formed therein a well for containing the temperature control means.

The thermally conductive block preferably has formed therein at least one well for receiving a temperature sensor, and a fluid well 212 for receiving a stream of temperature control fluid, and fluid flow conduit means 110 for introducing fluid into the fluid well from outside the vacuum chamber of the ion implant system and for carrying fluid from the fluid well outside said vacuum chamber without introducing fluid into said vacuum chamber are provided in the exemplary embodiment.

The rupturing means associated with the vaporizer means comprises, in a preferred form, means such as thrust cup 310 forming a projection which is constructed, configured, disposed and adapted to engage the sealed container of ion source material at one point and means such as the end of the thrust rod and associated structure which are adapted to engage the sealed container at another point for forcing the sealed container against the projection.

The means for transmitting force from the actuator means comprises, in the exemplary embodiment, a flexible gas tight seal, such as the bellows, or a diaphragm, etc., means for applying force to the side of the flexible gas tight seal outside the vacuum chamber and means for transmitting movement of the flexible gas tight seal to the means adapted to engage the sealed container at another point for thereby applying force to the sealed container.

The present invention also contemplates the method of introducing an ion source into the vacuum chamber of ion implant equipment which includes providing ion source material in a sealed, breakable vial, introducing the ion source material into a vaporizer block composed of high thermal conductivity material in a well therein and providing means on the vaporizer block for breaking the vial upon application of force to said breaking means. The vaporizer block then heated, either before or after it is introduced into the vacuum chamber, or both before and after such introduction. The vaporizer block is positioned in the vacuum chamber of the ion implant equipment in gas tight sealed relation thereto to permit a high vacuum to be provided in said vacuum chamber and, thereafter a force is applied through flexible wall means to the breaking means to break the vial of ion source material.

Heating is normally accomplished at least in part while the vaporizer block is in the vacuum chamber and includes controlling the temperature of the vaporizer block before and after breaking the vial of ion source material. The step of heating the vaporizer may further include preheating the vaporizer block before introducing the vaporizer block into the vacuum chamber, and controlling the temperature of the vaporizer block preferably includes introducing heating and cooling to the vaporizer block at the same time or at alternating times and sensing the temperature of the vaporizer block.

INDUSTRIAL APPLICATION

This invention is used in the semiconductor industry principally and may be used in other industries in which ion implantation is used to alter the characteristics of materials. The foregoing is merely exemplary of one preferred way of making and using the invention and is not limiting of the scope or utility of the invention.

What is claimed is:

1. An evaporator adapted to contain a sealed container of ion source material for an ion implant system including a vacuum chamber, the evaporator comprising in combination:

a vaporizer comprising a thermally conductive block having formed therein a first well communicating with the vacuum chamber of said ion implant system, said well having disposed therein a sealed container of ion source material, a second well having temperature control means disposed therein, and a third well for receiving a temperature control fluid;

means for supporting said vaporizer in said vacuum chamber of said ion implant system and sealing said vaporizer to said vacuum chamber to permit establishment of a vacuum inside said first well of said vaporizer;

means for rupturing said sealed container of ion source material when said vaporizer is supported in vacuum tight relation to said vacuum chamber, said means for rupturing including a projection constructed, configured, disposed and engaging said container of ion source material, said projection being a part of means for transmitting a force to the sealed container in said first well, said means for transmitting force extending outside said vaporizer while being held in vacuum tight relation to said vaporizer, and means for circulating a temperature control medium to said third well in said vaporizer.

* * * * *